United States Patent [19]

Hiltebeitel et al.

[11] Patent Number: 4,984,214

[45] Date of Patent: Jan. 8, 1991

[54] MULTIPLEXED SERIAL REGISTER ARCHITECTURE FOR VRAM

[75] Inventors: Nathan R. Hiltebeitel, South Burlington; Robert Tamlyn; Steven W. Tomashot, both of Jericho, all of Vt.

[73] Assignee: International Business Machines Corporation, Armonk, N.Y.

[21] Appl. No.: 446,032

[22] Filed: Dec. 5, 1989

[51] Int. Cl.⁵ .......................... G11C 7/00; G11C 8/00
[52] U.S. Cl. .......................... 365/230.05; 365/230.02
[58] Field of Search .............. 365/230.05, 230.02, 365/230.03, 230.08, 230.09, 239, 240, 189.05, 189.02

[56] References Cited

U.S. PATENT DOCUMENTS

| | | | |
|---|---|---|---|
| Re. 32,708 | 7/1988 | Itoh | 365/189 |
| 4,541,075 | 9/1985 | Dill et al. | 365/189 |
| 4,648,077 | 3/1987 | Pinkham et al. | 365/240 |
| 4,680,738 | 7/1987 | Tam | 365/239 |
| 4,683,555 | 7/1987 | Pinkham | 365/215 |
| 4,688,063 | 9/1987 | Lu et al. | 357/23.6 |
| 4,754,433 | 6/1988 | Chin et al. | 365/189 |
| 4,757,477 | 7/1988 | Nagayama et al. | 365/230.05 |
| 4,769,789 | 9/1988 | Noguchi et al. | 365/219 X |
| 4,773,045 | 9/1988 | Ogawa | 365/78 |
| 4,858,190 | 8/1989 | Yamaguchi et al. | 365/189.05 |

OTHER PUBLICATIONS

"A 256K Dual Port Memory," Ishimoto et al, ISSCC 1985, IEEE International Solid-State Circuits Conf., pp. 38-39 & 300.
"All Points Addressable Raster Display Memory," Matick et al, IBM J. Res. Develop., vol. 28, No. 4, Jul. 1984, pp. 379-392.

*Primary Examiner*—Joseph A. Popek
*Attorney, Agent, or Firm*—Mark F. Chadurjian

[57] ABSTRACT

A dual-port DRAM in which a single serial latch is shared between two pairs of folded bit lines from two arrays of memory cells. A first set of mux devices selects one of the two pairs of folded bit lines from each of the arrays, and a second set of mux devices selectively couple one of the remaining folded bit line pairs to either the parallel port or the serial latch for access to the serial port. This arrangement greatly decreases the consumption of chip real estate. At the same time, it makes unlimited vertical scrolling possible through the use of a copy mode that can be carried out in two operating cycles, and facilitates masked writing, while at the same time reducing clocking complexity.

6 Claims, 3 Drawing Sheets

MULTIPLEXED SERIAL REGISTER ARCHITECTURE FOR VRAM

BACKGROUND OF THE INVENTION

1 Technical Field

The invention relates to multi-port dynamic random access memory (or DRAM) chips, and more particularly to a multiplexed serial architecture for a video DRAM (or VRAM).

2 Background Art

In concert with the general trend in the DRAM industry directed to doubling the density of memory chips every two - three years, the applications of DRAMs have been extended from the conventional random (or parallel) access mode to a serial access mode. In the parallel access mode, a given word line is selected in each memory array, and a given bit line (or bit line pair, in the case of the folded bit line arrangement shown e.g. in U.S. Pat. No. RE 32,708 to Hitachi) within the array is selected, such that the same memory location in all of the arrays is available for either reading or writing at the same time. In a serial access mode, after a given word line is accessed, a plurality of bit lines coupled to the word line are addressed, and the respective bits of information are read out in a serial fashion.

During the 1980s the general idea of a single DRAM having both serial and parallel access capabilities first appeared. In such arrangements, the chip has two output ports—one serial, one parallel. The serial port interfaces with a plurality of latches connected up to form a shift register latch (SRL), and the parallel port is coupled to the data lines as in a conventional DRAM. See e.g. U.S. Pat. No 4,541,075 (issued to Dill et al. and assigned to IBM); see also U.S. Pat No. 4,639,890, U.S. Pat. No. 4,648,077, and U.S. Pat. No. 4,683,555 (all assigned to Texas Instruments), and an article by Ishimoto et al entitled "A 256K Dual Port Memory," *International Solid State Circuits Conference*, Digest of Technical Papers, February 1985, p. 38–39.

In the dual-port arrangements disclosed in the above references, each array of memory cells has its own plurality of sense amplifiers and shift register latches. Another example of such an arrangement is shown in an article by Matick et al, entitled "All Points Addressable Raster Display Memory," *IBM Journal of Research and Development*, Vol. 28, No. 4, July 1984, pp. 379–392). In this paper, the two memory cell "islands" shown in FIG. 5 are two subarrays that share common sense amplifiers (the two subarrays are not independent arrays, because they depend on the same set of sense amplifiers to provide sensing. If two independent arrays shared the same sense amps, the cycle time of the memory would be doubled). Note that the sense amplifier is separated from the shift register array by a portion of the memory array.

In the general DRAM art, multiplexing schemes have appeared that enable one functional block to carry out a multiplicity of related operations. Examples of multiplexing in the DRAM art include U.S. Pat. No. 4,680,738 (issued to Tam and assigned to AMD—one of two shift register chains of a dual-port DRAM receive muxed address selection inputs in order to selectively bypass a multiplexed output operation); U.S. Pat. No. 4,773,048 (issued to Ogawa and assigned to Fujitsu—the bit line inputs/outputs are muxed between the serial and parallel ports, to enable parallel data transfers), and U.S. Pat. No. 4,754,433 (issued to Chin et al. and assigned to IBM—the bit lines of a conventional DRAM are muxed onto I/O lines, which in turn are muxed onto data lines).

In the dual-port DRAM art, the use of a separate shift register for every independent array takes up a large amount of chip real estate. Thus, there is a need in the art to reduce the number of shift register latches as much as possible, without sacrificing operating modes or performance (i.e., access speed).

SUMMARY OF THE INVENTION

It is thus an object of the invention to provide a dual-port DRAM that reduces the consumption of chip real estate.

It is another object of the invention to provide a dual-port DRAM that minimizes the number of shift register latches needed to support a serial access mode.

It is yet another object of the invention to minimize the number of shift register latches without adversely affecting either the overall operation of the memory or the performance of the memory.

The foregoing and other objects of the invention are realized by a dual-port DRAM in which a single serial latch is shared between two pairs of folded bit lines from two arrays of memory cells. A first set of mux devices selects one of the two pairs of folded bit lines from each of the arrays, and a second set of mux devices selectively couple one of the remaining folded bit line pairs to either the parallel port or the serial latch for access to the serial port. This arrangement greatly decreases the consumption of chip real estate. At the same time, it makes unlimited vertical scrolling possible through the use of a copy mode that can be carried out in two operating cycles, and facilitates masked writing, while at the same time reducing clocking complexity.

BRIEF DESCRIPTION OF THE DRAWING

The foregoing and other features of the invention will become more apparent upon a review of the description of the best mode for carrying out the invention as rendered below. In the description to follow, reference will be made to the accompanying Drawing, in which.

DESCRIPTION OF THE BEST MODE FOR CARRYING OUT THE INVENTION

Figure 1:
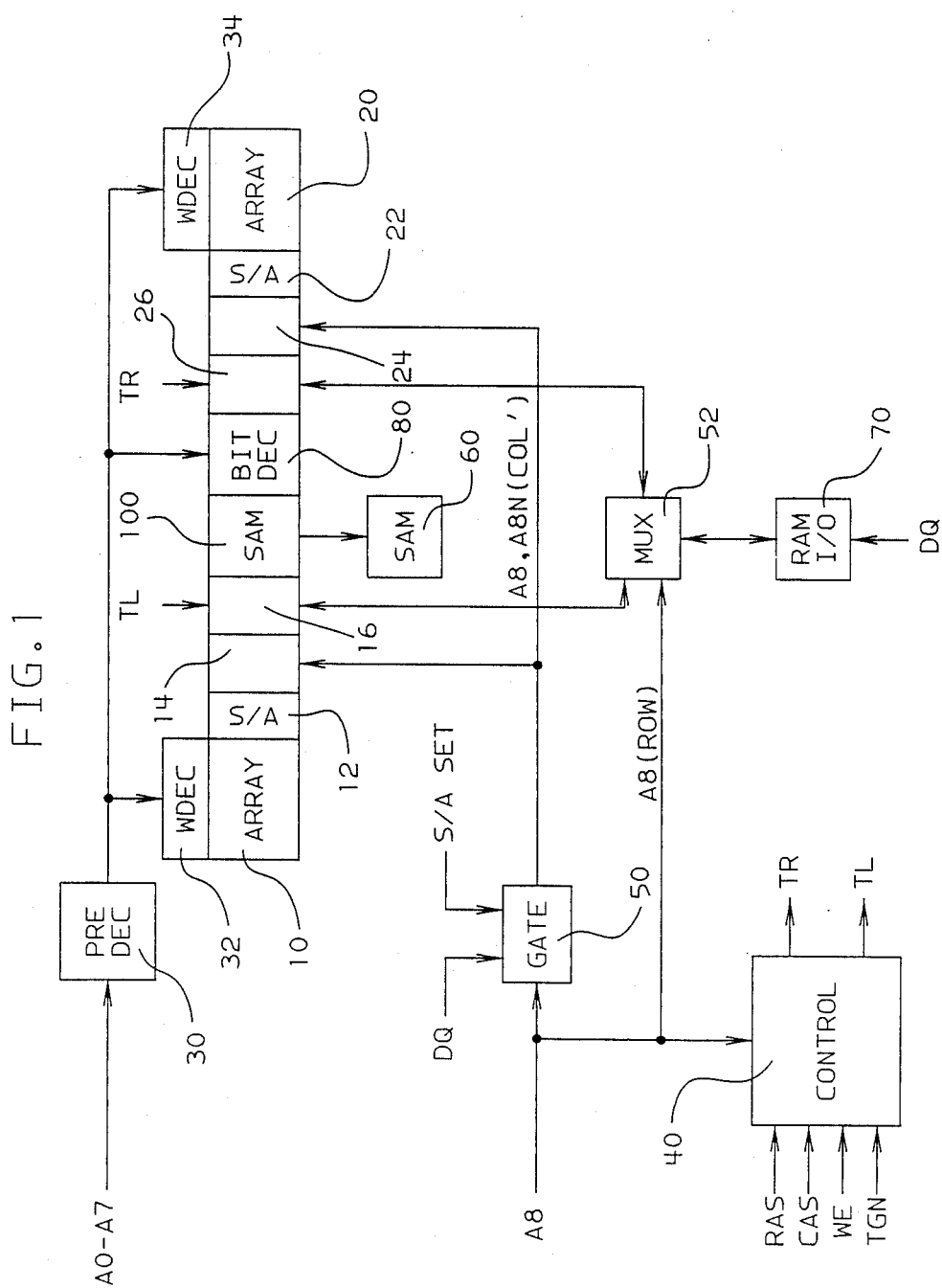
FIG. 1 is a circuit block diagram of a dual-port DRAM in accordance with the invention.

FIG. 1 is a general block diagram showing the overall layout of a dual-port DRAM (also referred to as a "video RAM" or "VRAM") of the invention. Two memory arrays 10 and 20 are coupled to a common series of serially addressable memory (SAM) latches 100. Although the memory arrays 10, 20 could be of any density, in the invention they are two 128K arrays (each being 512 bit lines of 128 word lines) of a four megabit DRAM, such that there are thirty-two of these arrays on the chip. The arrays are paired such that there are sixteen series of SAM latches 100 on the chip, each series being coupled to a separate serial access port 60.

Thus, the chip has sixteen serial access ports 60 and sixteen parallel access ports 70.

Each array 10, 20 has respective sense amplifiers 12, 22 associated therewith. As such, each array is functionally independent, and any word line on each array can be accessed in one conventional RAS-CAS DRAM access cycle, as well known in the art (and as described in more detail below). The sense amplifiers are of the conventional cross-coupled differential latch construction. In the present embodiment, the sense amps are made up of parallel latches made up of two cross-coupled n-type transistors and two cross-coupled p-type transistors. While any conventional DRAM memory cell structure could be used in the invention, it is preferred to utilize the substrate plate trench capacitor and p-type transfer device construction described in more detail in U.S. Pat. No. 4,688,063 issued to Lu et al and assigned to IBM (the teachings of which are herein incorporated by reference). In practice, the n and p latches of the sense amps are disposed on either side of the array, although as a practical matter they can be disposed in the same portion of the memory array. The memory array consists of pairs of folded bit lines as generally described in the aforementioned RE No. 32,708 Hitachi patent, coupled to a single sense amp latch pair.

The sense amps 12, 22 are selectively coupled to both the parallel port and the serial port by bit line mux blocks 14, 24. As shown in more detail in FIG. 2, the bit line mux 14 consists of devices 14A-14D. These devices selectively couple one of the bit line pairs 10A+10B, 10C+10D to the serial/parallel mux block 16. This muxing of two bit line pairs is repeated for all of the SAM latches 100 coupled to array 10. Note also that this arrangement is repeated for array 20, for coupling to the same SAM latch. Thus, a feature of the invention is that each SAM latch receives data selectively from four bit line pairs.

Figure 2:
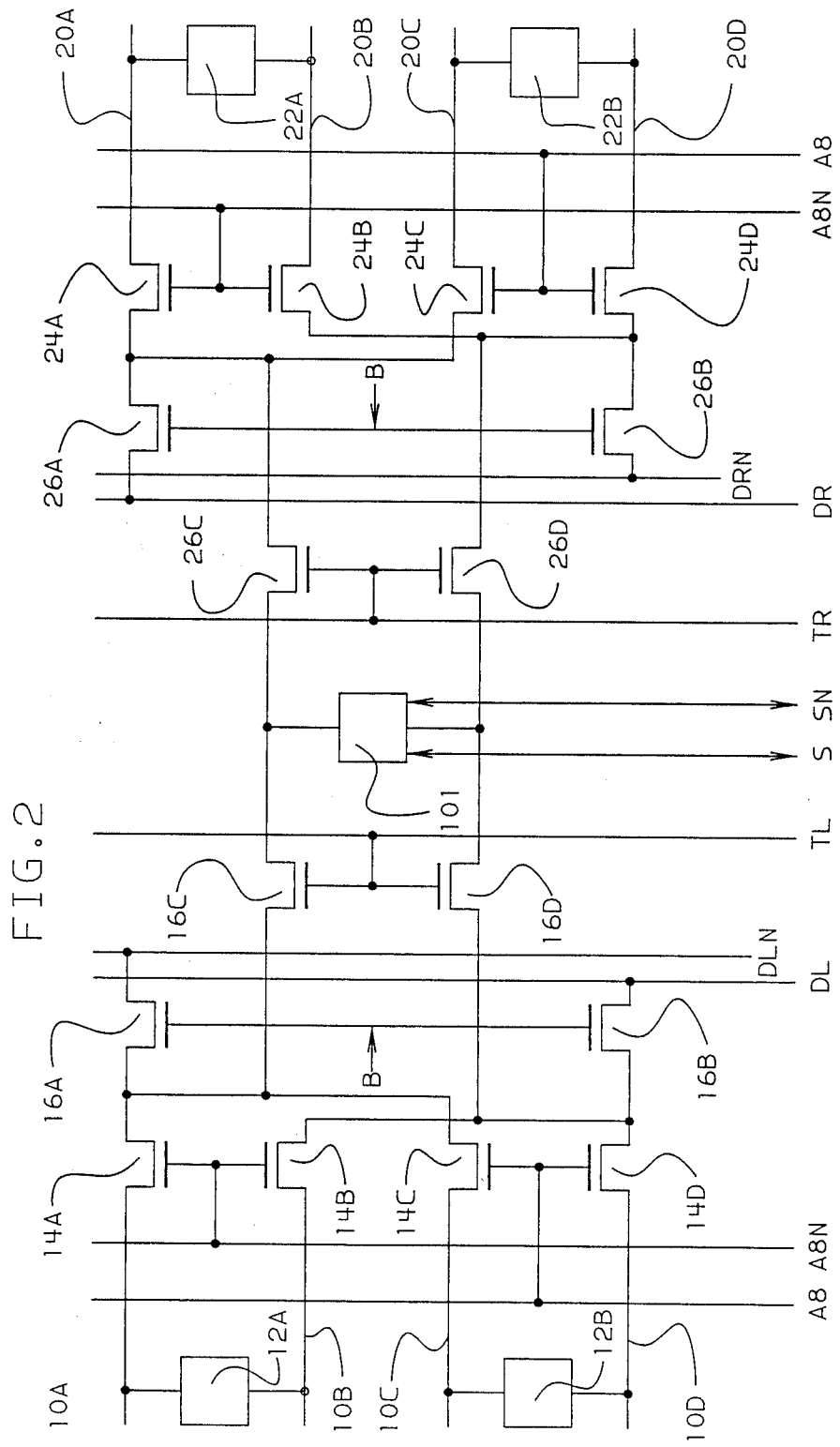
FIG. 2 is a detailed circuit diagram of a portion of the block diagram shown in FIG. 1.
Figure 3:
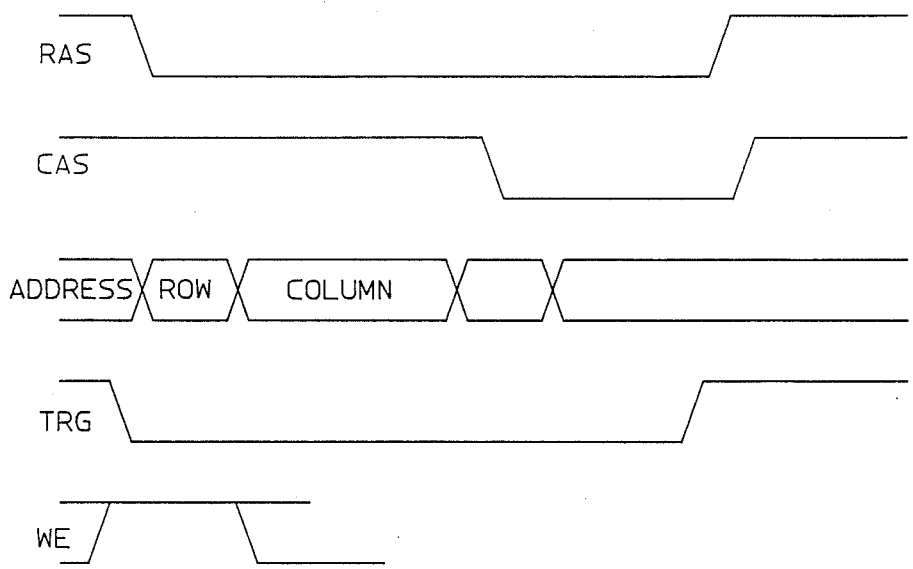
FIG. 3 is a timing diagram of a serial read cycle carried out utilizing the dual-port DRAM of the invention.

With reference to FIG. 1, bit line mux devices 14, 24 are controlled by the most significant column address bit A8. The address signal is passed to the bit line muxes by gate 50 when the S/A SET signal rises, indicating that the sense amps have been set. S/A SET can be generated by monitoring a sense amp hooked to a dummy bit line pair that models the worst case delay in setting the sense amp, or by ANDing together the sense amp control signals that set the sense amp. Thus, SIA SET indicates that the sense amps have fired, such that gate 50 passes addresses signal A8 to control bit line muxing. With reference to FIG. 2, if address signal A8 is low, signal A8N is high, such that devices 14A, 14B, 24A and 24B turn on, coupling bit line pairs 10A+10B, 20A+20B to the circuitry to be described below. If address signal A8 is high, A8N is low, and devices 14C, 14D, 24C, 24D turn on to couple the respective bit line pairs 10C+10D, 20C+20D to the circuitry to be described below.

Referring to FIG. 1, the bit line mux blocks 14, 24 are coupled to the serial/parallel switching blocks 16, 26. As shown in more detail in FIG. 2, the serial/parallel switching block 16 is
made up of four devices 16A-16D, and the serial/parallel switching block 26 is made up of four devices 26A-26D. In general, devices 16A, 16B and 26A, 26B operate to couple the bit line pair selected by the bit line mux blocks 14, 24 to the data lines, and via the data lines to the parallel input/output port 70. Conversely, devices 16C, 16D and 26C, 26D couple the bit line pair selected by the bit line mux blocks 14, 24 to the serial latch 100.

Devices 16A, 16B and 26A, 26B are coupled to signals B, BN that are sent from the bit decoder 80. As shown in FIG. 1, the bit decoder receives column address signals A0-A7 from the row/column predecoder 30. The respective row and column address signals are received by the chip from an external signal source (e.g., a microprocessor), as time multiplexed address signals on the same input pins. As a function of the particular state of the address signals, the bit decoder 80 selects one of the bit line pairs on each of the arrays. In this manner, devices 16A, 16B and 26A, 26B operate the same way as conventional transfer devices that couple the selected bit lines to the data lines in a conventional DRAM arrangement. In the invention, the data lines DL, DLN and DR, DRN are coupled to the parallel access port 70 by a mux device 52. The mux device 52 is controlled by the most significant row address A8. When A8 is high, data lines DL, DLN are coupled to the parallel port 70; when A8 is low, data lines DR, DRN are coupled to the parallel port 70.

Devices 16C, 16D and 26C, 26D are controlled by a transfer signals TR and TL. Signals TR and TL are generated by control block 40 when external signal TRG is low when external signal RAS falls, indicating that a serial access is to be carried out in that cycle. When TRG is low, the logic state of the row address signal A8 is latched by control block 40. If row address signal A8 is low, signal TR rises to turn on devices 26A, 26B while signal TL stays low to keep devices 16A, 16B off. If row address signal A8 is high, signal TL rises, turning on devices 16A, 16B, while signal TR stays low to keep devices 26A, 26B off.

Thus, selected bit line pairs are coupled to SAM latches 100 for serial access. Again, as shown in FIG. 2, SAM latch 101 is coupled to four bit line pairs, two pairs from each array. Latch 101 is comprised of the same pair of parallel n-type and p-type cross-coupled devices that comprise the sense amps. In practice, the devices of latch 101 can be designed to be smaller than the devices of sense latches 12 and 22. The differential outputs of latch 101 are coupled to serial access lines S, SN by decoding devices (not shown), that couple the latch to the lines as a function of a received address generated by an address counter (not shown). Lines S, SN are directly coupled to the serial output port 60.

Thus, in the general architecture of the invention, a single serial latch is selectively coupled to four pairs of folded bit lines (two from each adjacent memory array) by a first set of bit line mux devices that select two out of the four bit line pairs, and a second set of serial/parallel mux devices that steer data signals from one of the remaining two bit line pairs to the serial port via the serial latch or to the parallel port via the data lines. From a silicon area standpoint, the invention greatly reduces chip real estate, because the number of serial latches is reduced by four times as compared to the conventional method of providing one serial latch per pair of bit lines. Moreover, the architecture of the invention provides a logical/physical muxing scheme that provides additional advantages in certain operational modes.

The salient operating modes of the invention will now be described:

EXAMPLE A

Parallel Port Read

A read cycle through the parallel port is the same as a read cycle for a conventional DRAM. When the RAS signal falls, the address signals A0–A8 (indicating the row address) are latched. The address signals A0–A7 are decoded by the word decoders 32 and 34, to select one of the word lines in memory cell arrays 10, 20. At the same time, the row address signal A8 is used to operate the mux device 52 so as to choose between the data line pairs DR, DRN and DL, DLN. In a read cycle, the external WE signal is high when RAS falls.

Then, when the external CAS signal falls, the address signals A0–A8 (now indicating the bit address) are again latched. Signals A0–A7 are decoded by the bit decoder 80, and as a result the device pairs 16A, 16B and 26A, 26B are selected by signal B. Note that in a parallel access mode signal TRG is high throughout the cycle; as a result, neither the devices 16B, 16C nor the devices 26C, 26D turn on at any point during the cycle. While the bit address signals are being decoded, the selected word line rises. When the accessed bit lines engage in charge transfer with the selected cell, the sense amps turn on to amplify the difference between the bit lines. When this happens the S/A SET signal rises, and as a result the column address A8 is passed by the gating device 50 to carry out the muxing of the two bit line pairs in each of the bit line mux blocks 14, 24. Note that when this happens, the data from only one of the two selected bit lines flows through the pair of devices 16A, 16B or 26A, 26B chosen by the bit decoder, and the resulting data flows through the chosen data lines to the parallel port 70. In other words, once the bit line muxing is completed by blocks 14, 24, the data flows through the remainder of the selection/muxing circuitry and out to the parallel port, because the appropriate transistors have been turned on ahead of time.

EXAMPLE B

Parallel Port Write

Again, the parallel port write cycle is generally the same as a conventional DRAM write cycle. When RAS falls, a write cycle is indicated if the WE signal is low. Thus, data input to the parallel port 70 will be read through the selected data lines and through the selected serial/parallel mux devices to the selected bit line pairs, wherein the foregoing selections are done in the same manner as was described in conjunction with a parallel port read cycle described above.

EXAMPLE C

Figure 4:
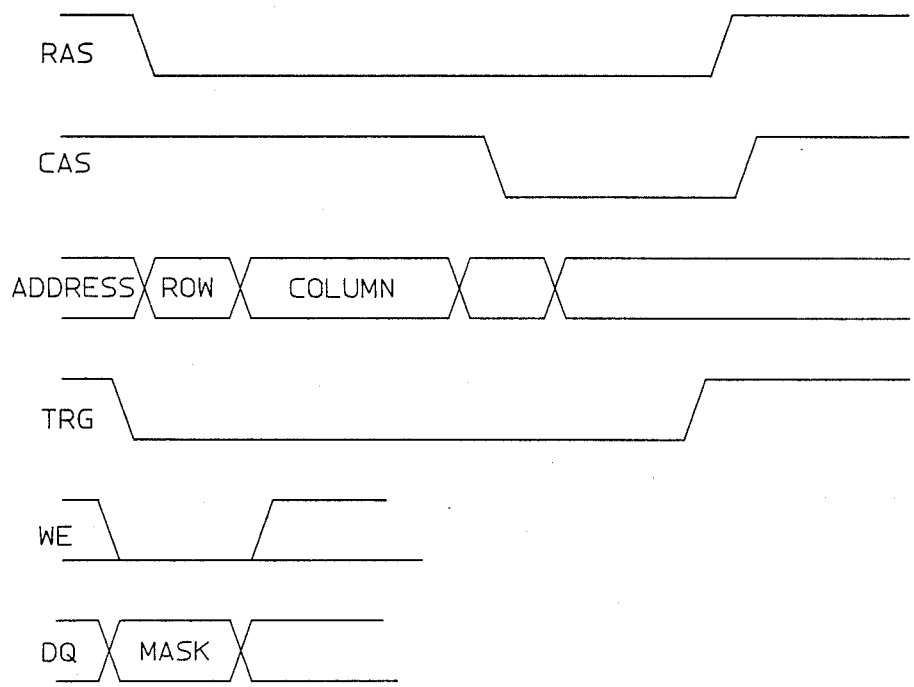
FIG. 4 is a timing diagram of a serial write cycle carried out utilizing the dual-port DRAM of the invention.

Serial Port Read (FIG. 4)

In general, information is read serially by reading information into all of the SAM latches 100, and then accessing the latches in a serial fashion. Again, a read cycle is indicated by WE being high when RAS falls. A serial access cycle is indicated by signal TRG being low when RAS falls. The bit line mux operation is carried out the same way as in the above-described operational modes. Here, however, signal B from the bit decoder 80 does not rise; rather, either TL or TR rise to turn on either devices 16C, 16D or 26C, 26D, as a function of the state of the row address A8. Thus, data from the selected bit line pair is passed by the bit line mux devices 14 to the serial latch 101 as a function of the selection signals TR, TL. An address counter (not shown) provides a plurality of consecutive address signals corresponding to respective ones of the SAM latches, such that the latches 100 are coupled to the serial port 60 one at a time, so as to provide the data to the port in a serial fashion.

EXAMPLE D

Serial Port Write (FIG. 5)

The serial port write is analogous to the serial port read. Both the TGN and the WE signals are low at RAS time. Data provided to the serial port 60 is provided to the latches 101 in a serial fashion, as a function of the addresses from an address counter as previously described. The high-order bit and word line decode operations are carried out, such that when the data is available at a particular latch 101 it is driven through the selected serial devices 16C, 16D or 26C, 26D to the selected bit line pair as controlled by the bit line mux devices 14.

A feature of the serial read and write cycles described above is that a copy mode (wherein data from one word line may be completely written into another word line) may be carried out in only two access cycles. This greatly enhances the operation of the memory in a video application in which data is to be vertically scrolled across the screen. In a first access cycle, data is read from the selected word line in one of the arrays, through all of the bit line pairs to which it is coupled, into all of the latches 101 coupled to the array; then, in a second access cycle, the data in all of the latches 101 is written into all of the bit switch pairs that the word line to be written to is coupled. Compare this to the situation in which each array has its own sense amps and serial latches. Because there is no sharing of latches between the respective arrays, the only way one word line could be copied into another is to read one word line into the serial latches associated with that array, serially read out all of these latches, serially write in the data from the first latches into the latches associated with the memory array having the target word line, and write from the latches into the word line. Such an operation is extremely time consuming; in fact, copy modes are not generally carried out in the art because of the extremely long time it would take to carry out the operation using a conventional dual-port DRAM arrangement. By use of the dual-port architecture of the invention, this operation can be carried out quickly and efficiently, to the point where it can now be used in the art.

Another advantage of the invention results in carrying out a masked write operation. In many DRAMs, the I/O pads referred to as DQ indicate which I/O are to be active in that particular cycle. When a given DQ pad is high when RAS falls, we know that the associated serial I/O port will not be active during that cycle. In the invention, the DQ inputs are used as a control input to gate 50 that passes the column address signal A8 that controls the bit line mux block 14. Thus, if a given serial I/O is to be inactive during a given transfer cycle, the high DQ signal will prevent A8 from actuating the bit line mux block 14. As a result, the port will be deactivated. Note that this can be accomplished because access to the serial port only occurs when the bit line mux is carried out; that is, access can be denied very simply, without additional deactivation circuitry. Note that this operation can also be carried out for the parallel port; moreover, instead of having dedicated input pads, this masking operation could be provided by some sort of logical combination of the signals already provided to the chip. Again, this flexibility is principally provided by arranging the bit line mux and serial/parallel access mux devices serially, such that access to either port can be disabled by simply disabling the bit line muxes. Yet another advantage is realized by the architecture of the invention. Because the bit line muxes primarily control access, all critical timing dependencies (e.g., making sure the sense amps have turned on fully before carrying out a bit line mux operation) can be accounted for in turning on the bit line muxes. That is, as described previously, the other serial/parallel mux devices, as well as the choice between data lines, can be carried out without concern as to precisely when their associated devices turn on—the critical timing is controlled by the bit line mux operation. This eliminates the need in the conventional arrangements to control both the bit line mux and the port accesses as a function of critical timings. Eliminating these critical timings saves still more circuitry.

It is to be understood that various modifications can be made to the structures and teachings of the best mode as described above without departing from the spirit and scope of the present invention. For example, while the invention has been described with reference to a 4Mb DRAM, it could be practiced in a DRAM of any density. The particular operating modes were described with reference to well-known DRAM control signals—they would work equally well with other signals or with different signals, so long as the same general intelligence is provided. While the external signals have been described as coming from an off-chip microprocessor, future integration may very well enable these signals to be provided from an on-chip source. While the invention shows four bit line pairs coupled to a common serial latch, in practice more bit lines could be so coupled, so long as appropriate signals were used to control the muxing operation therebetween. Finally, while the serial latches have been described as being a separate series of latches that are serially accessed through an address counter, a conventional shift register latch system (wherein the output of one serial latch is fed to the input of a succeeding latch, and so on so as to serially read out through the serial I/O port) could be used.

What is claimed is:

1. A dual-port DRAM, comprising:
   first and second arrays of memory cells, each comprising a plurality of word lines and a plurality of bit lines coupled to a plurality of memory cells, and a plurality of sense amplifiers coupled to said plurality of bit lines;
   a parallel input-output port;
   a serial input/output port;
   a first set of transistor devices coupled to a set of said plurality of bit lines of said first array of memory cells and to a set of said plurality of bit lines of said second array of memory cells, for selecting at least one of said plurality of bit lines from each of said first and second arrays of memory cells;
   a second set of transistor devices responsive to a first enable signal for coupling at least one of said plurality of bit lines selected by said first set of transistor devices to said parallel input/output port, and
   a third set of transistor devices responsive to a second enable signal for coupling at least one of said plurality of bit lines selected by said first set of transistor devices to said serial input/output port.

2. A dual-port DRAM operated in serial or parallel mode, comprising:
   first and second arrays of memory cells, each comprising a plurality of word lines and a plurality of bit lines coupled to said cells, and a plurality of sense amplifiers, each coupled to adjacent ones of said plurality of bit lines, forming a plurality of bit line pairs;
   a parallel input/output port;
   a series of serial latches, each of said serial latches coupled to at least two of said plurality of bit line pairs of each of said first and second arrays of memory cells; and
   a series of switching devices that either selectively couple one of said bit line pairs from one of said first and second arrays of memory cells to said parallel input/output port when the DRAM is operated in parallel mode, or that selectively couple one of said bit line pairs from one of said first and second arrays of memory cells to one of said series of serial latches when the DRAM is operated in serial mode.

3. A dual-port DRAM, comprising:
   first and second arrays of memory cells, comprising a plurality of bit lines and a plurality of word lines coupled to said memory cells, and a plurality of sense amplifiers, each coupled to adjacent ones of said bit lines, to form a plurality of bit line pairs;
   a parallel input/output port;
   a series of serial latches, each of said serial latches coupled to two pairs of said plurality of bit line pairs of each of said first and second arrays of memory cells;
   a first plurality of transistor devices for selectively passing one of said two pairs of said plurality of bit line pairs of each of said first and second arrays of memory cells; and
   a second plurality of transistor devices for selectively passing one of bit line pairs passed by said first plurality of transistor devices to either said parallel I/O port or to a respective one of said series of serial latches, as a function of external signals that indicate whether said DRAM is to be operated in a parallel or serial fashion, respectively.

4. A method of operating a dual-port DRAM having a first array of memory cells having a plurality of word lines and a plurality of pairs of folded bit lines, a second array of memory cells having a plurality of word lines and a plurality of pairs of folded bit lines, a serial input/output port, a parallel input/output port, a plurality of first switching devices for controlling access to the serial and parallel input/output ports, and a plurality of second switching devices for controlling the access between the plurality of folded bit line pairs of each of the first and second arrays of memory cells and the plurality of first mux devices, comprising the steps of:
   determining whether the dual-port DRAM is to be operated in a serial write mode, a serial read mode, a parallel write mode, or a parallel read mode;
   selecting one of said plurality of word lines in each of said first and second arrays of memory cells;
   selecting between said first switching devices to allow one of said plurality of pairs of folded bit lines of one of said first and second arrays of memory cells to have access to said serial input/output port only if the DRAM is operating in a serial write mode or a serial read mode, or to have access to said parallel input/output port only if the DRAM is operating in a parallel write mode or a parallel read mode; and selecting between said plurality of second switching devices to selectively couple one of said plurality of pairs of folded bit lines of each of said first and second arrays of memory cells to said plurality of first switching devices.

5. The method of operating a dual-port DRAM as recited in claim 4, wherein a copy page mode is carried out in two operating cycles, by carrying out the steps of:

performing a serial read mode from a first selected word line in the first array of memory cells to generate a plurality of read bits; and performing a serial write access to a second selected word line in the second array of memory cells to store said plurality of read bits therein.

6. A dual-port DRAM, comprising a first array of memory cells having a plurality of word lines and a plurality of pairs of folded bit lines, a second array of memory cells having a plurality of word lines and a plurality of pairs of folded bit lines, a serial input/output port, a parallel input/output port, a plurality of first switching devices for controlling access to the serial and parallel input/output ports, and a plurality of second switching devices for controlling the access between the plurality of folded bit line pairs of each of the first and second arrays of memory cells and the plurality of first switching devices.

* * * * *